United States Patent
Kim et al.

(10) Patent No.: US 9,380,716 B2
(45) Date of Patent: Jun. 28, 2016

(54) MOBILE TERMINAL AND METHOD OF FABRICATING CASE THEREOF

(71) Applicant: LG ELECTRONICS INC., Seoul (KR)

(72) Inventors: Myungsun Kim, Seoul (KR); Soobong Jo, Seoul (KR); Donghwan Jeong, Seoul (KR); Seongteg Woo, Seoul (KR); Joonho Yun, Seoul (KR); Moonchul Choi, Seoul (KR); Hyunseok Oh, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 436 days.

(21) Appl. No.: 13/899,804

(22) Filed: May 22, 2013

(65) Prior Publication Data

US 2014/0055962 A1  Feb. 27, 2014

(30) Foreign Application Priority Data

Aug. 23, 2012 (KR) .................. 10-2012-0092499

(51) Int. Cl.
| | |
|---|---|
| *B29D 99/00* | (2010.01) |
| *H05K 5/00* | (2006.01) |
| *H04M 1/18* | (2006.01) |
| *H04M 1/02* | (2006.01) |

(52) U.S. Cl.
CPC ............ *H05K 5/0086* (2013.01); *B29D 99/006* (2013.01); *H04M 1/185* (2013.01); *H04M 1/0262* (2013.01)

(58) Field of Classification Search
CPC ............. H05K 5/0086; H04M 1/0262; H04M 1/0283; B29D 99/006
USPC ......................................... 361/752–753, 814
See application file for complete search history.

(56) References Cited

U.S. PATENT DOCUMENTS

2012/0314350 A1* 12/2012 Choi .................... H04M 1/0202
                                              361/679.01
2013/0043054 A1*  2/2013 Ho ..................... B29C 45/14336
                                              174/50

* cited by examiner

*Primary Examiner* — Ahmad D Barnes
(74) *Attorney, Agent, or Firm* — Ked & Associates, LLP

(57) ABSTRACT

A mobile terminal having a case defining an external appearance thereof, and a method of manufacturing such a case, are provided. The case may include a base formed of a resin material and having a recessed portion, a sheet disposed within the recessed portion and formed of a material that is different from that of the base, the material of the sheet having greater rigidity than that of the base, and a reinforcing member filled between the base and the sheet to integrally couple the base and the sheet. The rigidity of the material of the reinforcing member may have an intermediate value between the rigidity of the base and the rigidity of the sheet.

15 Claims, 6 Drawing Sheets

MOBILE TERMINAL AND METHOD OF FABRICATING CASE THEREOF

CROSS-REFERENCE TO RELATED APPLICATION(S)

Pursuant to 35 U.S.C. §119(a), this application claims the benefit of earlier filing date and right of priority to Korean Application No. 10-2012-0092499, filed on Aug. 23, 2012, the contents of which is incorporated by reference herein in its entirety.

BACKGROUND

1. Field

This relates to a mobile terminal having a case and a method for fabricating the case.

2. Background

Mobile terminals are portable electronic devices which may have at least one of voice and telephone call functions, information input and/or output functions, a data storage function and the like. Multifunctional mobile terminals may also capture still or moving images, play music or video files, play games, receive broadcast signals and the like, so as to be an integrated multimedia player. The mobile terminal may include a case defining its outer appearance. The case may enhance the appearance of the mobile terminal in addition to simply protecting the mobile terminal.

BRIEF DESCRIPTION OF THE DRAWINGS

The embodiments will be described in detail with reference to the following drawings in which like reference numerals refer to like elements wherein.

DETAILED DESCRIPTION

Description will now be provided in detail of a mobile terminal and as associated fabrication method, according to exemplary embodiments, with reference to the accompanying drawings. Simply for ease of description with reference to the drawings, the same or equivalent components will be provided with the same reference numbers, and description thereof will not be repeated. An expression in the singular form will also cover the expression in the plural form unless otherwise indicated obviously from the context. Hereinafter, the suffixes "module" and "unit or portion" for components used herein are merely used to facilitate the description, and thus they are not granted a specific meaning or function.

Mobile terminals described herein may include, for example, cellular phones, smart phones, laptop computers, digital broadcasting terminals, personal digital assistants (PDAs), portable multimedia players (PMPs), E-books, navigators, and the like. However, various features as embodied and broadly described herein may be applied to stationary terminals such as, for example, digital TVs, desktop computers and the like, and are not necessarily applicable only to mobile terminals.

Figure 1:
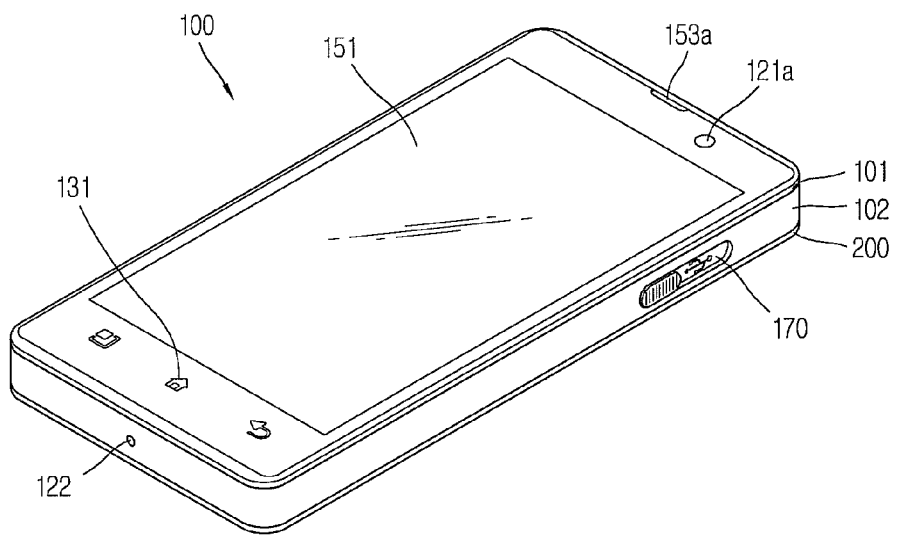
FIG. 1 is a front perspective view of a mobile terminal in accordance with one exemplary embodiment as broadly described herein.
Figure 2:
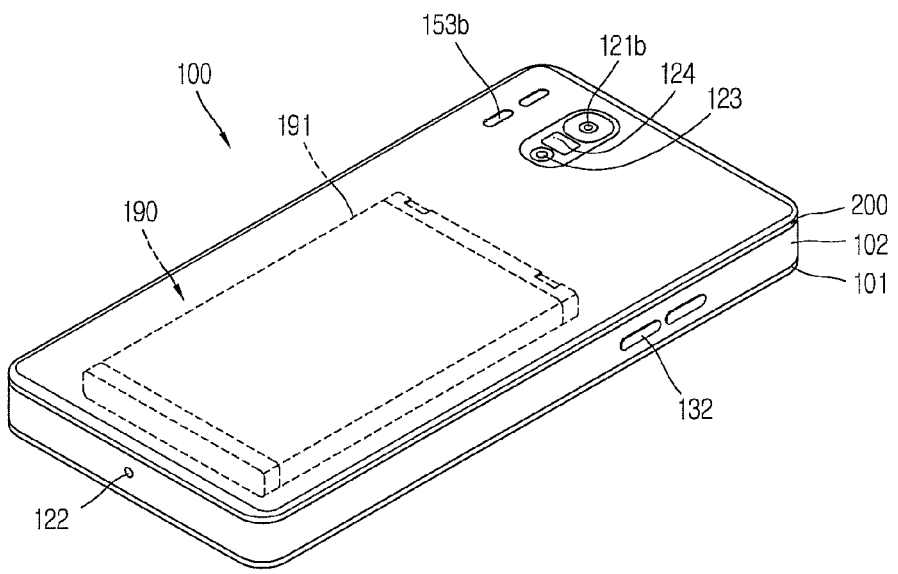
FIG. 2 is a rear perspective view of the mobile terminal shown in FIG. 1.

The mobile terminal 100 shown in FIGS. 1 and 2 has a bar type terminal body. However, features described herein may be applicable, but not limited to, a watch type, a clip type, a glass type, or a various structures, such as a slide type, a folder type, a swing type, a swivel type and the like, having two or more bodies coupled so as to be movable relative to each other.

The mobile terminal 100 may include a case (referred to also as a casing, housing, cover, etc.) defining an appearance of the mobile terminal 100. In this exemplary embodiment, such a casing may include a front case 101 and a rear case 102. Various electronic components may be mounted in a space formed between the front case 101 and the rear case 102. In certain embodiments, at least one intermediate case may be disposed between the front and rear cases 101 and 102. A battery cover 200 for covering a battery 191 may be detachably disposed on the rear case 102.

Such cases may be injection molded using, for example, a resin material, or be formed of a metal, such as stainless steel (STS), titanium (Ti), aluminum (Al) or the like.

The front surface of the terminal body may include a display 151, a first audio output module 153a, a first camera 121a, a first manipulation device 131, and other components as appropriate, and a side surface thereof may include a microphone 122, an interface 170, a second manipulation device 132, and other components as appropriate.

The display 151 may output information processed in the mobile terminal 100. The display 151 may display (output) visual information using, for example, at least one of a Liquid Crystal Display (LCD), a Thin Film Transistor-Liquid Crystal Display (TFT-LCD), an Organic Light-Emitting Diode (OLED), a flexible display, a three-dimensional (3D) display, an e-ink display or the like.

The display 151 may include a touch sensing device for receiving a control command input in a touch manner, so that, when a portion on the display 151 is touched, the touch sensing device may sense the touch input and content corresponding to the touched portion may be input/accessed/executed. Such touch inputs may include, for example, text or numerals or menu items which are instructed or selected in various modes.

Such a touch sensing device may be transparent such that visual information output on the display 151 may be viewed, and may have a structure for enhancing visibility of a touch screen in a relatively bright environment. In the exemplary embodiment shown in FIG. 1, the display 151 may occupy most of the front surface of the front case 102.

The first audio output module 153a and the first camera 121a may be disposed at a region adjacent to one of two opposite end portions of the display 151, and the first manipulation device 131 and the microphone 122 may be disposed at a region adjacent to the other end portion. The second manipulation device 132 (see FIG. 2), the interface 170 and the like may be disposed at a side surface of the terminal body.

The first audio output module 153a may be implemented as a receiver to transfer a sound signal to a user's ear, or a loud speaker for outputting various alarm sounds or multimedia reproduction sounds.

Sounds generated via the first audio output module 153a may be emitted through an assembly gap between neighboring structures, so that a separately formed hole for outputting sound is not visible from the outside, thereby simplifying the appearance of the terminal 100.

The first camera 121a may receive and process image frames of still pictures or video obtained by image sensors in a video call mode or a capturing mode. The processed image frames may be displayed on a display 151.

A user input device may be manipulated to input/receive commands for controlling operation of the mobile terminal 100, and may include, for example, the first and second manipulation devices 131 and 132. The first and second manipulation devices 131 and 132 may be referred to as a manipulating portion of the mobile terminal. Such a manipulating portion may employ a variety of tactile devices that a user can touch, push, scroll or the like for manipulation.

The first manipulation 131 is shown as a touch key in FIG. 1, but, in certain embodiments, the first manipulation device 131 may instead be, for example, a mechanical key, a combination of a touch key and a push key, or other combination as appropriate.

Contents input via the first and second manipulation devices 131 and 132 may be set variously. For example, the first manipulation device 131 may be configured to receive command inputs such as menu, home, cancel, search or the like, and the second manipulation device 132 may be configured to receive command inputs, such as a volume adjustment of sound output by the first audio output module 153a, conversion of the display 151 into a touch recognition mode, or the like.

The microphone 122 may receive, for example, a user's voice, other sounds and the like. The microphone 122 may be disposed in various places to receive stereo sound.

The interface 170 may provide a path for data exchange between the mobile terminal 100 and external devices. For example, the interface 170 may provide at least one of wired/wireless earphone ports, ports for short-range communication (e.g., IrDA, Bluetooth, WLAN, etc.), power supply terminals for power supply to the mobile terminal and the like. The interface 170 may be provided as a card socket for coupling to external cards, such as a Subscriber Identity Module (SIM), a User Identity Module (UIM), a memory card for storage of information and the like.

Referring to FIG. 2, a second camera 121b may be provided at the rear surface of the terminal body. The second camera 121b may face a direction which is substantially opposite to a direction faced by the first camera 121a. Also, the second camera 121b may have different characteristics, such as, for example resolution/pixel capability from those of the first camera 121a.

For instance, the first camera 121a may operate at a relatively lower pixel level (lower resolution). Thus, the first camera 121a may be useful for a user to capture his face and send it to another party during a video call or the like. On the other hand, the second camera 121b may operate with at a relatively higher pixel level (higher resolution) such that it may obtain higher quality pictures for later use. The first and second cameras 121a and 121b may be installed in the terminal body to be rotatable, or may pop up, or extend from, the terminal body when in use.

A flash 123 and a mirror 124 may be provided, for example, adjacent to the second camera 121b, to operate in conjunction with the second camera 121b when taking a picture using the second camera 121b. The mirror 124 may cooperate with the second camera 121b to allow a user to photograph himself in a self-portrait mode.

A second audio output module 153b may also be provided on the rear surface of the terminal body. The second audio output module 153b may cooperate with the first audio output unit 153a to provide stereo output.

A broadcast signal receiving antenna may be disposed at the side surface of the terminal body, in addition to an antenna for call connection. In certain embodiments, the antenna may form a part of the broadcast receiving module, and may be retractably installed in the terminal body.

A power supply device 190 may supply power to the mobile terminal 100. The power supply device 190 may be, for example, a battery 191, which may be mounted inside the terminal body or detachably coupled to the terminal body. FIG. 2 shows the battery cover 200 coupled to the rear case 101 to cover the battery 191 so as to prevent separation of the battery 191, and protect the battery 191 from external impact and foreign materials.

Figure 3:
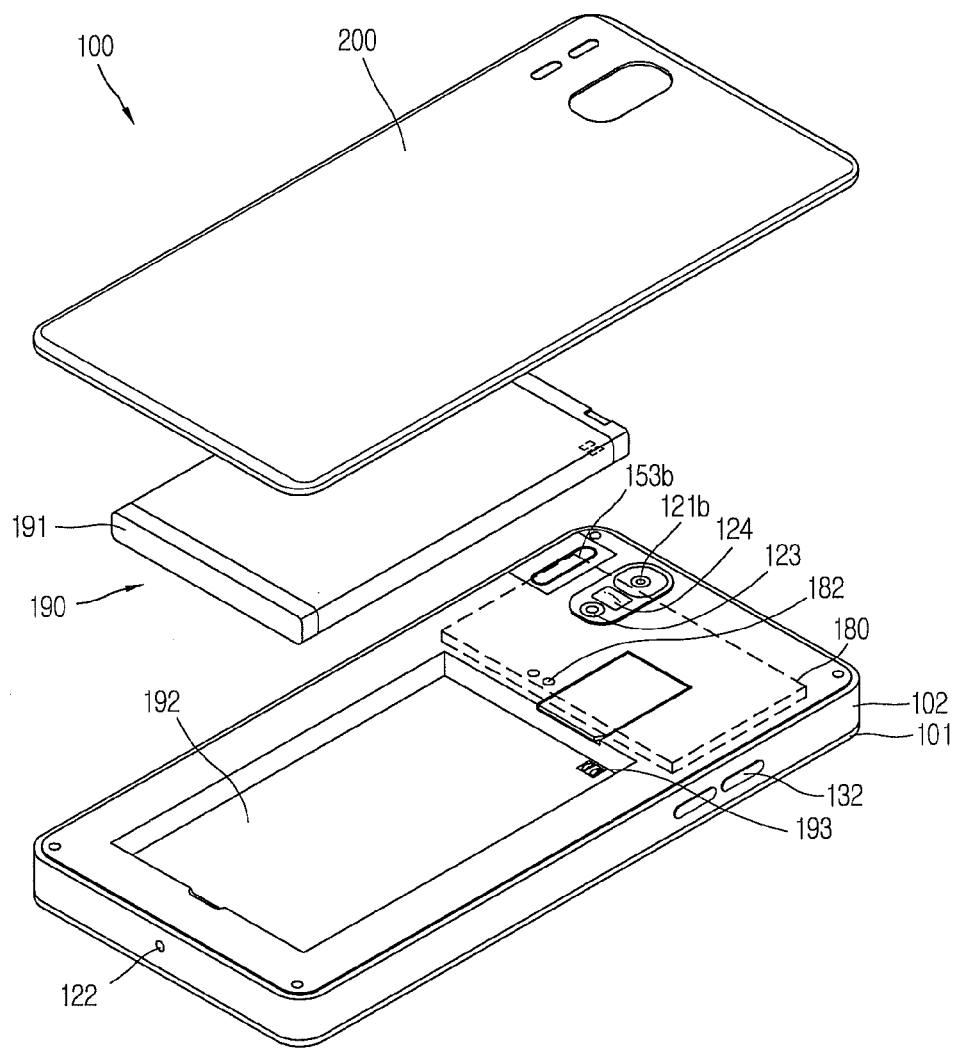
FIG. 3 is a disassembled rear perspective view of the mobile terminal shown in FIGS. 1 and 2.

FIG. 3 is a disassembled perspective view of the mobile terminal 100 including power supply 190 shown in FIG. 2.

As shown in FIG. 3, the rear case 102 may include a recessed battery accommodating portion 192. A size/shape of the battery accommodating portion 192 may to that of the battery 191 such that the battery 191 may be accommodated therein.

A connection terminal 193 to be connected to the battery 191 may be provided at the battery accommodating portion 192. The battery 191 may be connected to supply power to a printed circuit board 180 disposed in the terminal body. The battery 191, the battery accommodating portion 192 and the connection terminal 193 may together form the power supply device 190.

The battery cover 200 may be detachably coupled to the rear case 102 to cover the battery 191, preventing separation of the battery 191 and protecting the battery 191 from external impacts and foreign materials.

Hereinafter, a more detailed description of the battery cover 200 will be provided, as one example of a case which is relatively slim but has sufficient rigidity to provide thickness and weight while still protecting the mobile terminal 100.

Figure 4:
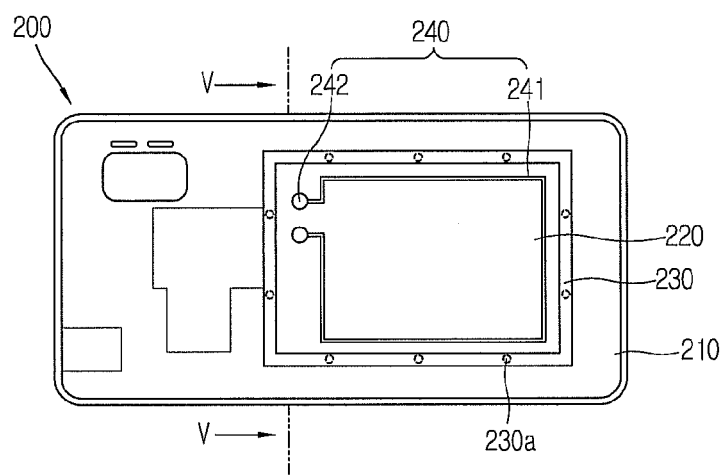
FIG. 4 is a bottom view of a battery cover shown in FIG. 3.

FIG. 4 is a bottom view of the battery cover 200 shown in FIG. 3. The following structure of the battery cover 200 may be applied to a variety of different types of cases (for example, the front case and/or the rear case) that partially define an external appearance of the terminal body.

As shown in FIG. 4, the battery cover 200 may define a rear surface of the terminal body. The battery cover 200 may include a base 210, a sheet 220 and a reinforcing member 230. The base 210 may be made of, for example, a resin material. For example, the base 210 may be formed by injecting polycarbonate into a first mold 310 (see FIG. 8). This may allow the battery cover 200 to be fabricated at a relatively low cost irrespective of complexities of inner and outer shapes/contour thereof. To ensure rigidity, the base 210 may contain glass fiber or carbon fiber (for example, about 10 wt %). Also, end portions of the base 210 may be curved (see FIG. 5) so as to cover end portions of the rear case 102 when the battery cover 200 is coupled to the rear case 102.

The base 210 may have a hollow, or open, portion. The hollow portion may have a size/shape corresponding to the battery accommodation portion 192 (i.e., a size as the same substantially or slightly greater than the battery accommodating portion 192). The sheet 220 may be positioned within the hollow portion, and may be made of a different material which provides greater rigidity than the base 210. The sheet 220, for example, may be made of glass fiber reinforced plastic (GFRP) or carbon fiber reinforced plastic (CFRP). The sheet 220 may be thinner (for example, less than 0.25 mm) than the base 210, and have a size corresponding to the battery 191.

The reinforcing member 230 may be interposed between the base 210 and the sheet 220 to integrally couple the base 210 and the sheet 220. The reinforcing member 230 may be made of a material having a rigidity at an intermediate value between the rigidities of the materials forming the base 210 and the sheet 220. As one example, the reinforcing member 230 may be formed of resin containing glass fiber or carbon fiber. The content of glass fiber or carbon fiber may have an intermediate value (for example, 45 wt %) of the contents of glass fiber or carbon fiber of the base 210 and the sheet 220.

Figure 8:
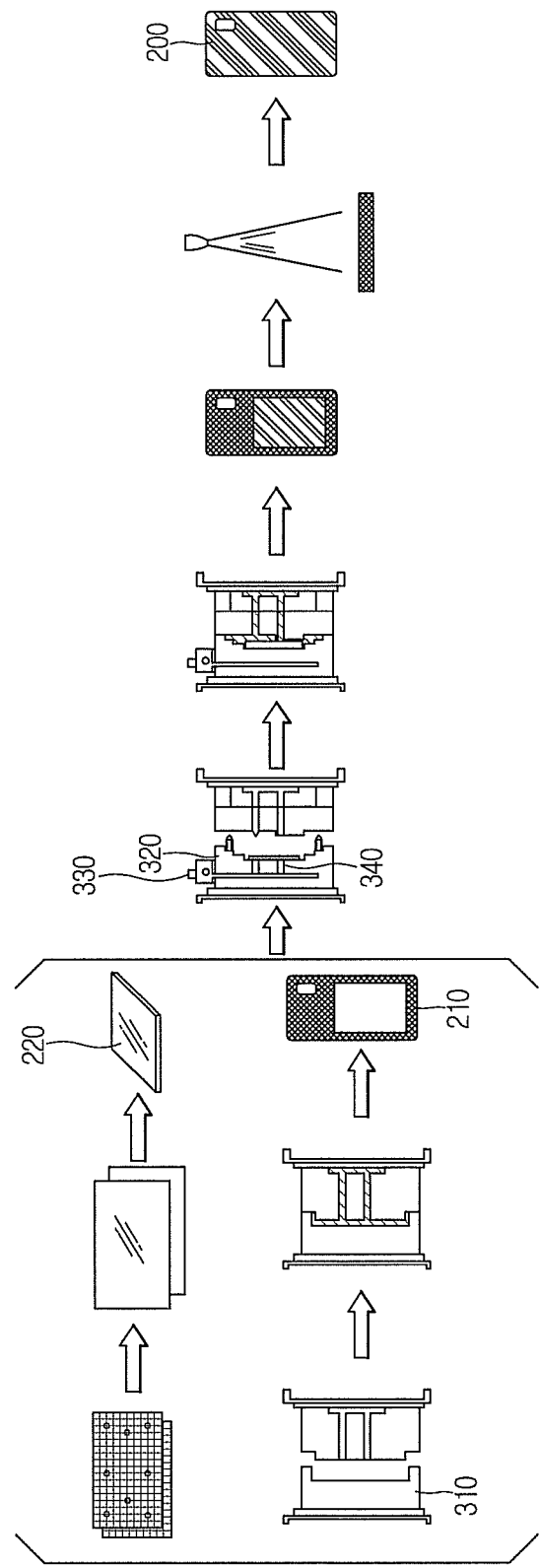

A filled portion 231 may be filled in between the base 210 and the sheet 220 by inserting the base 210 and the sheet 220 in a second mold 320 (see FIG. 8). Hence, borders between the base 210 and the reinforcing member 230 and between the sheet 220 and the reinforcing member 230 may be formed as the reinforcing member 230 is melted and solidified to be integrally coupled to the base 210 and the sheet 220. The reinforcing member 230 may be formed of a resin material which contains less glass fiber or carbon fiber than the resin material forming the sheet 220. This may prevent deformation of the base 210 and the sheet 220 due to a difference of volumetric shrinkage between the base 210 and the sheet 220 upon a phase change of the reinforcing member 230 in response to filling.

The reinforcing member 230 may completely surround the sheet 220, as shown in FIG. 4, where the reinforcing member 230 has a uniform width and forms a closed loop which surrounds the sheet 220.

An antenna 240 for transmission or reception of a wireless signal in relation to wireless communications may be disposed on a rear surface of the sheet 220. The antenna 240 may be electrically connected to the printed circuit board 180 when the battery cover 200 is coupled to the terminal body. The antenna 240 may provide for wireless communications between the mobile terminal 100 and a wireless communication system or between the mobile terminal 100 and a network where the mobile terminal 100 is located. For example, the antenna 240 may be configured to perform at least one function of broadcast reception, mobile communication, near field communication, wireless Internet and position information transmission/reception.

Still referring to FIG. 4, the antenna 240 may execute near field communication, and may include an antenna coil 241 which allows for the near field communication. The antenna coil 241 may be wound along edges of the sheet 220, and patterned by plating, deposition, nano-wire adhesion and the like. Terminals 242 connected to the antenna coil 241 may contact peer terminals 182 when the battery cover 200 is coupled to the terminal body, so as to electrically connect the antenna 240 and the printed circuit board 180 to each other.

With this structure, the antenna 240 may be formed on the sheet 220 which is thinner than the base 210. This may allow the battery cover 200 to provide for the wireless communication function without affecting thickness of the battery cover 200. Also, space occupied by the antenna 240 within the terminal body may be reduced/eliminated.

Figure 5:
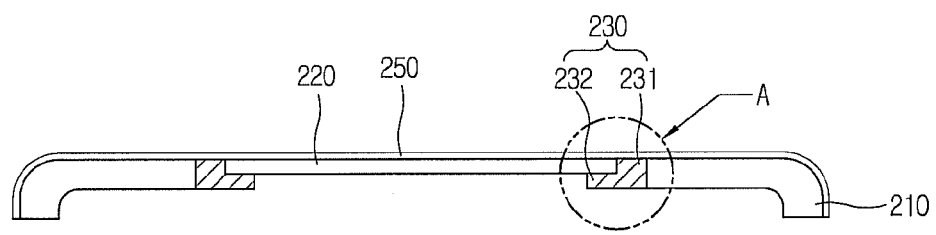
FIG. 5 is a sectional view taken along the line V-V of FIG. 4.

As shown in FIG. 5, the reinforcing member 230 may include the filled portion 231 and a supporting portion 232. The filled portion 231 may be located between the base 210 and the sheet 220 for coupling therebetween. The base 210, the filled portion 231 and the sheet 220 may be coplanar with one another. The supporting portion 232 may extend from the filled portion 231 to cover a rear surface portion of the sheet 220 for support. The supporting portion 232 may have a recessed shape leading into the filled portion 231 so as to form a space in which the sheet 220 may be received and mounted. The sheet 230 may have greater rigidity than the base 210 and be slimmer than the base 210. This reduced thickness may allow for use of a battery 191 having a larger capacity. For example, at least a part of the battery 191 may be accommodated within a space covered by the supporting portion 232.

Figure 6:
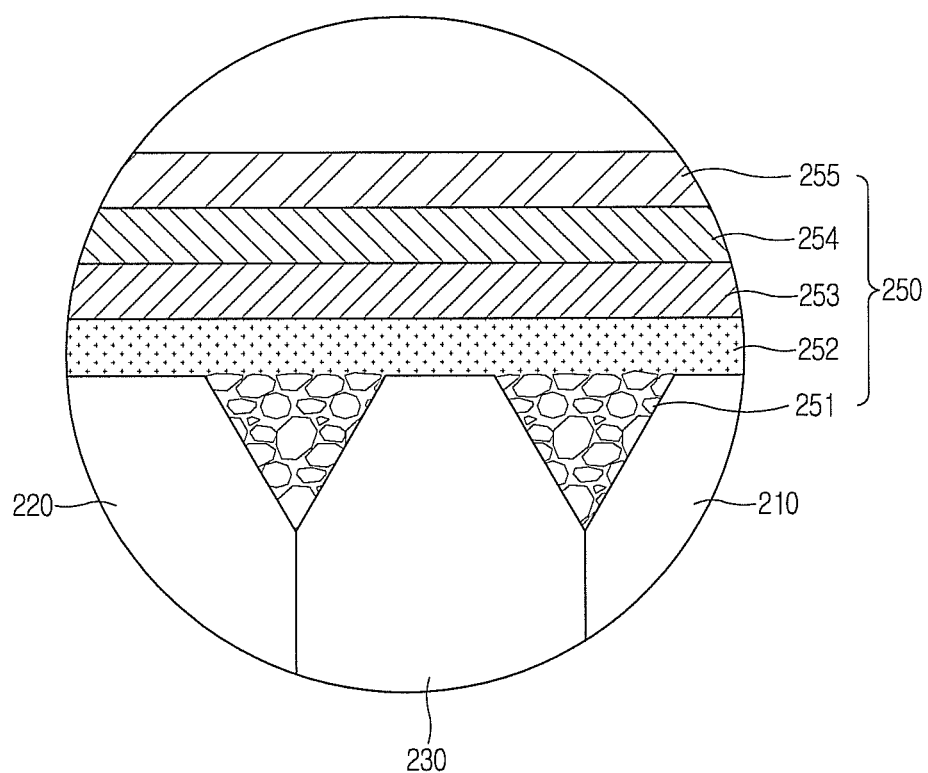
FIG. 6 is an enlarged view of a part A shown in FIG. 5.

As shown in FIG. 6, the reinforcing member 230 may have gaps between the base 210 and the sheet 220 that form parting lines, which may be undesirable when directly exposed to the outside. Therefore, in order to shield the gaps and surface-process an outer surface of the battery cover 200, a coating layer 250 may cover the base 210, the sheet 220 and the reinforcing member 230.

The coating layer 250 may include a plurality of particles 251 which are filled in the gap between the base 210 and the reinforcing member 230 and the gap between the sheet 220 and the reinforcing member 230. The plurality of particles 251 may be filled in the gaps to reduce width and depth of the gap. Accordingly, the gaps may be hidden, and the parting lines may be less visually recognizable.

The plurality of particles 251 may be, for example, nano metal particles. The plurality of particles 251 may have the same shape and size, or have different shapes and sizes from one another as shown in FIG. 6. When each particle 251 has a different shape or size, porosity may be minimized. In certain embodiments, the plurality of particles 251 may have a circular shape to be easily moved into the inclined gap.

As the surface of the battery cover 200 is processed and the plurality of particles 251 are covered with the coating layer 250, a smooth surface connecting the base 210, the filled portion 231 and the sheet 220 may be implemented. The coating layer 250 may further include a base layer 252, a primer layer 253, a color layer 254 and a top layer 255.

The base layer 252 may cover the base 210, the filled portion 231, the sheet 220 and the plurality of particles 251. The base layer 252 may fill air gaps formed between the plurality of particles 251. The base layer 252 may contain an organic polymer and a solvent. The organic polymer may be coupled to the base 210, the filled portion 231, the sheet 220 and the plurality of particles 251, dissolved by the solvent and evenly distributed.

The base layer 252 may contain pigments for realizing a color of the base layer 252, and additives for processing the surfaces of the base 210, the filled portion 231 and the sheet 220. The additives may contain at least one material which may block colors of the base 210, the filled portion 231 and the sheet 220, an anti-yellowing function which may prevent discoloration, and the like.

The primer layer 253 may be deposited on the base layer 252. The primer layer 253 may protect the surfaces of the base 210, the filled portion 231 and the sheet 220 from corrosion or physical impacts, and may improve an adhesive force with the coating layer 250, for example, the color layer 254.

The color layer 254 may be deposited on the primer layer 253, and may contain pigments for realizing the color of the coating layer 250. The color layer 254 may have a predetermined color such that the base 210, the filled portion 231 and the sheet 220 may appear to be a single member without visibly exposed lines therebetween.

The top layer 255 may cover the color layer 254 to protect the coating layer 250. The top layer 255 may be, for example, a urethane (UT) coating layer, a soft feeling (SF) coating layer, or an ultraviolet (UV) hardening layer formed of a material hardened by UV radiation.

Figure 7:
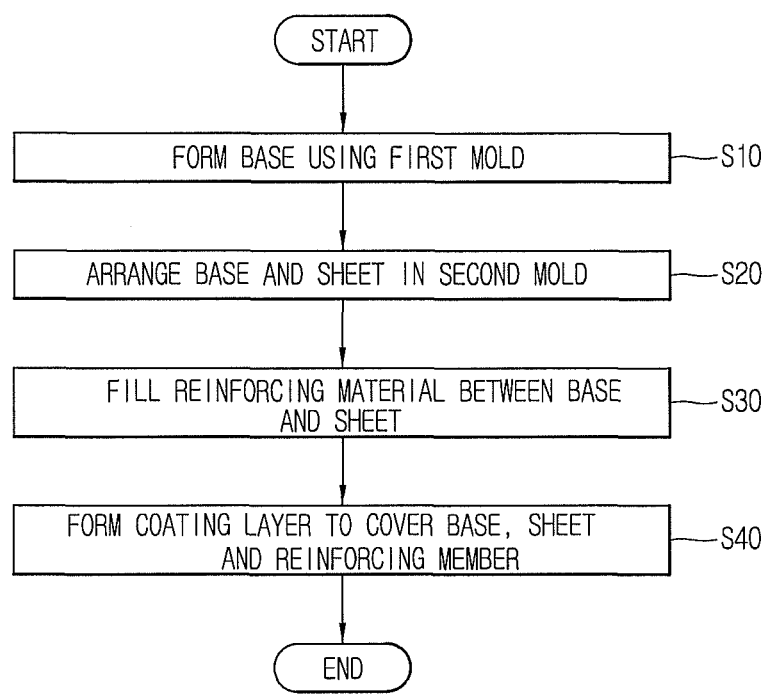
FIGS. 7 and 8 are a flowchart and a process view of a method for fabricating a case in accordance with one exemplary embodiment as broadly described herein.

FIGS. 7 and 8 are a flowchart and a process view both showing a method for fabricating a case of a mobile terminal, in accordance with one exemplary embodiment as broadly described herein.

As shown in FIGS. 7 and 8, in order to fabricate a case (i.e., the battery cover 200 in the drawings) defining the external appearance of the mobile terminal 100, first, a base 210 having a hollow portion may be formed using a first mold 310 (S10), and a sheet 220 may be formed. The sheet 220 may be made of a material which is thinner than the material of the base 210 but has greater rigidity than the material of the base 210. The sheet 220 may be made of composite materials having glass fiber or carbon fiber contained in epoxy resin, namely, made by using a glass fiber reinforced plastic (GFRP) or carbon fiber reinforced plastic (CFRP) sheet.

Afterwards, the base 210 may be aligned in a second mold 320 and the sheet 220 may be aligned inside the hollow portion of the base 210 (S20). At this point, an adsorption portion 340 connected to a vacuum device 330 may be formed on a portion on which the sheet 220 is disposed in the second mold 320. The sheet 220 may be absorbed by the vacuum device 330 and fixed at a preset position within the hollow portion. The base 210 may be structurally fixed at a predetermined position by the second mold 320 or fixed by being absorbed by the vacuum device 330, similar to the sheet 220.

Next, a reinforcing member 230 formed of a material exhibiting greater rigidity than that of the material forming the base 210 may be filled between the base 210 and the sheet 220 (S30). In detail, a plurality of gates 230a (see FIG. 4) may be disposed between the base 210 and the sheet 220. As shown in FIG. 4, the plurality of gates 230a may be spaced apart from one another by predetermined intervals to surround the sheet 220, thereby forming a loop. Afterwards, resin containing glass fiber or carbon fiber may be filled through the plurality of gates 230a. The content of glass fiber or carbon fiber in the reinforcing member 230 may be less than the content of glass fiber or carbon fiber in the sheet 220. This may prevent deformation of the base 210 and the sheet 220 due to a difference of volumetric shrinkage between the base 210 and the sheet 220 upon a phase change of the reinforcing member 230 in response to the filling.

Next, post-processing may be executed to provide the battery cover 200 with a finished appearance. The post-processing may include forming a coating layer 250 to cover the base 210, the sheet 220 and the reinforcing member 230 (S40). As aforementioned, the coating layer 250 may contain a plurality of particles 251 filled in the gap between the base 210 and the reinforcing member 230 and the gap between the sheet 220 and the reinforcing member 230, so as to hide the gaps.

When so configured, the reinforcing member 230 may be filled between the base 210 and the sheet 220 to integrally couple the base 210 and the sheet 220 to each other. Also, a rigidity of the reinforcing member 230 may have an intermediate value between the rigidity of the base 210 and the rigidity of the sheet 220. Accordingly, deformation of the base 210 and the sheet 220 due to the difference of volumetric shrinkage therebetween may be prevented upon the phase change of the reinforcing member 230 in response to the filling. This may result in providing a similar case having sufficient rigidity.

Also, the sheet 220 may be thinner than the base 210. Accordingly, more space may be available to accommodate the battery 191, and thus the battery 191 may have a larger capacity due to the reduced thickness. An antenna 240 may be formed on a rear surface of the sheet 220. This may allow the battery cover 200 to be more slim and to provide a wireless communication function previously accommodated within the terminal body.

A case for a mobile terminal is provided that may be fabricated using different structure, fabricating method and material.

A case for a mobile terminal and method of fabricating the same are provided, the case having a reduced thickness and satisfactory rigidity.

A mobile terminal, as embodied and broadly described herein, may include a case defining an appearance of the terminal, wherein the case may include a base formed of resin and having a hollow portion, a sheet disposed within the hollow portion and formed of a material which is different from that of the base and has higher rigidity than the base, and a reinforcing member filled between the base and the sheet to integrally couple the base and the sheet to each other, the reinforcing member being made of a material exhibiting rigidity having an intermediate value of the rigidities of the base and the sheet.

In one embodiment, borders between the base and the reinforcing member and between the sheet and the reinforcing member may be formed as the reinforcing member is melted and then solidified to be integrally coupled to the base and the sheet.

In another embodiment, the reinforcing member may completely surround the sheet.

In another embodiment, the sheet may be made of glass fiber reinforced plastic (GFRP) or carbon fiber reinforced plastic (CFRP), and the reinforcing member may be made of resin containing less glass fiber or carbon fiber than the sheet, to prevent deformation of the base and the sheet caused due to a difference of volumetric shrinkage between the base and the sheet upon a phase change of the reinforcing member in response to filling.

In another embodiment, the reinforcing member may include a filled portion filled between the base and the sheet, and a supporting portion extending from the filled portion to cover a rear surface of the sheet for support. The base, the filled portion and the sheet may be coplanar with one another.

In another embodiment, the case may further include a coating layer to cover the base, the sheet and the reinforcing member, and the coating layer may include a plurality of particles filled in a gap between the base and the reinforcing member and a gap between the sheet and the reinforcing member so as to hide the gaps. The plurality of particles may have different sizes to minimize porosity of the gap.

In another embodiment, the case may be detachably coupled to the main body to cover a battery mounted in a main body, and the sheet may be thinner than the base in thickness and have a shape corresponding to the battery. The case may further include an antenna unit disposed on a rear surface of the sheet to be electrically connected to a printed circuit board, disposed on the main body, when the case is coupled to the main body, and the antenna unit may be configured to transmit or receive a wireless signal in association with wireless communication.

A method of fabricating a case for a mobile terminal, in according with an embodiment as broadly described herein, may include forming a base using a first mold, the base having a hollow portion, aligning the base in a second mold and a sheet within the hollow portion; and filling a reinforcing member between the base and the sheet, the reinforcing member being made of a material exhibiting rigidity higher than the base.

In one embodiment, an adsorption portion connected to a vacuum device may be formed on a portion on which the sheet is disposed in the second mold, and the sheet may be absorbed by the vacuum device to be fixed onto a preset position within the hollow portion.

In another embodiment, the filling of the reinforcing member may include arranging a plurality of gates between the base and the sheet with being spaced apart from one another by predetermined intervals to surround the sheet so as to form a loop, and filling resin containing glass fiber or carbon fiber via the plurality of gates.

In another embodiment, the sheet may be made of glass fiber reinforced plastic (GFRP) or carbon fiber reinforced plastic (CFRP), and the reinforcing member may be made of resin containing less glass fiber or carbon fiber than the sheet, to prevent deformation of the base and the sheet caused due to a difference of volumetric shrinkage between the base and the sheet upon a phase change of the reinforcing member in response to the filling.

In another embodiment, the method may further include forming a coating layer to cover the base, the sheet and the reinforcing member, and the coating layer may contain a plurality of particles filled in a gap between the base and the reinforcing member and a gap between the sheet and the reinforcing member so as to hide the gaps.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A mobile terminal comprising:
    a main body including a printed circuit board and a battery accommodating portion;
    a case defining an external appearance of the terminal and configured to detachably couple to the main body to cover the battery accommodating portion, wherein the case includes:
        a base formed of a resin material and having a recessed portion;
        a sheet provided within the recessed portion and formed of a material that is different from that of the base, the material of the sheet having greater rigidity than that of the base;
        a reinforcing member including a reinforcing material filled between the base and the sheet to couple the base and the sheet, wherein a rigidity of the reinforcing material has an intermediate value between the rigidity of the material of the base and the rigidity of the material of the sheet; and
        an antenna including a plurality of terminals and provided on a surface of the sheet that faces the main body, wherein the main body includes a plurality of peer terminals electrically connected to the printed circuit board, and
    wherein the plurality of terminals are configured to contact with the plurality of peer terminals when the case is coupled to the main body so as to electrically connect the antenna and the printed circuit board.

2. The terminal of claim 1, wherein the reinforcing material is filled in a gap between a periphery of the recessed portion and a periphery of the sheet received therein such that mating surfaces between the base and the reinforcing member, and between the sheet and the reinforcing member, as the reinforcing material is melted and filled between the base and the sheet and then solidified so as to form the reinforcing member and integrally couple the base and the sheet.

3. The terminal of claim 1, wherein the reinforcing member completely surrounds a periphery of the sheet.

4. The terminal of claim 1, wherein the sheet is made of a glass fiber reinforced plastic (GFRP) or a carbon fiber reinforced plastic (CFRP), and wherein the reinforcing member is made of a resin material containing less glass fiber or carbon fiber than the sheet.

5. The terminal of claim 1, wherein the reinforcing member includes:
    a first portion filled between the base and the sheet; and
    a second portion that extends from an end of the first portion so as to cover a peripheral edge portion of the sheet and secure the sheet in place on the base.

6. The terminal of claim 5, wherein the peripheral edge portion of the sheet covered by the second portion of the reinforcing member is positioned on a surface of the sheet that faces an interior of the terminal.

7. The terminal of claim 6, wherein the peripheral edge portion of the sheet is received within a recess defined by the first and second portions of the reinforcing member.

8. The terminal of claim 1, further comprising a coating layer covering the base, the sheet and the reinforcing member, wherein the coating layer includes a plurality of particles filled in a gap formed between the base and the reinforcing member, and in a gap formed between the sheet and the reinforcing member.

9. The terminal of claim 8, wherein the plurality of particles have different sizes to minimize porosity of the filled gaps.

10. The terminal of claim 1, wherein the sheet is thinner than the base and a shape of the sheet corresponds to that of the battery.

11. A method of fabricating a case for a mobile terminal, the method comprising:

forming a base using a first mold, the base having a recessed portion;

aligning the base in a second mold and arranging a sheet within the recessed portion of the base; and filling a reinforcing material between the base and the sheet, the reinforcing material having a greater rigidity than that of the base, wherein the mobile terminal includes:

a main body including a printed circuit board and a battery accommodating portion;

the case defining an external appearance of the terminal and configured to detachably couple to the main body to cover the battery accommodating portion and, the case including:

the base formed of a resin material and having a recessed portion;

the sheet provided within the recessed portion and formed of a material that is different from that of the base, the material of the sheet having greater rigidity than that of the base;

a reinforcing member including the reinforcing material filled between the base and the sheet to couple the base and the sheet, wherein a rigidity of the reinforcing material has an intermediate value between the rigidity of the material of the base and the rigidity of the material of the sheet; and an antenna including a plurality of terminals and provided on a surface of the sheet facing the main body, wherein the main body includes a plurality of peer terminals electrically connected to the printed circuit board, and wherein the plurality of terminals are configured to contact with the plurality of peer terminals when the case is coupled to the main body so as to electrically connect the antenna and the printed circuit board.

12. The method of claim 11, wherein arranging a sheet within the recessed portion of the base comprises:

positioning the sheet in an adsorption area of the recessed portion that is coupled to a vacuum device; and operating the vacuum device so that the sheet is absorbed by the vacuum device and fixed at a preset position within the recessed portion.

13. The terminal of claim 11, wherein filling a reinforcing material between the base and the sheet comprises:

arranging a plurality of gates between the base and the sheet, the plurality of gates being spaced apart by predetermined intervals so as to surround a periphery of the sheet; and filling a resin material containing glass fiber or carbon fiber between the base and the sheet via the plurality of gates.

14. The method of claim 11, wherein the sheet is made of a glass fiber reinforced plastic (GFRP) material or a carbon fiber reinforced plastic (CFRP) material, and wherein the reinforcing member is made of a resin material containing less glass fiber or carbon fiber than that of the sheet.

15. The method of claim 12, further comprising forming a coating layer covering the base, the sheet and the reinforcing member, comprising filling a plurality of particles in a gap between the base and the reinforcing member, and in a gap between the sheet and the reinforcing member, so as to fill the gaps with the plurality of particles.

* * * * *